United States Patent [19]

Marcinkiewicz et al.

[11] Patent Number: 5,241,456
[45] Date of Patent: Aug. 31, 1993

[54] COMPACT HIGH DENSITY INTERCONNECT STRUCTURE

[75] Inventors: Walter M. Marcinkiewicz; Charles W. Eichelberger, both of Schenectady; Robert J. Wojnarowski, Ballston Lake, all of N.Y.

[73] Assignee: General Electric Company, Schenectady, N.Y.

[21] Appl. No.: 548,462

[22] Filed: Jul. 2, 1990

[51] Int. Cl.⁵ .............. H05K 1/00; H01L 23/043; H01L 23/051; H01L 23/053
[52] U.S. Cl. .................. 361/792; 174/250; 174/260; 174/261; 257/685; 257/686; 257/688; 257/700; 439/68; 361/730; 361/744; 361/761; 361/807
[58] Field of Search ............ 174/250, 251, 253, 255, 174/260, 261; 357/68, 69, 70, 71, 72, 73, 74, 80; 361/395, 396, 397, 400, 401, 404, 405, 409, 410, 412, 413, 414, 417, 419, 421; 439/68, 69, 71; 428/209, 901; 29/878

[56] References Cited

U.S. PATENT DOCUMENTS

| | | |
|---|---|---|
| 3,614,832 | 10/1971 | Chance et al. ............ 361/414 |
| 3,780,352 | 12/1973 | Redwanz ............ 361/414 |
| 3,903,590 | 9/1975 | Yokogawa ............ 357/80 |
| 4,466,181 | 8/1984 | Takishima ............ 357/75 |
| 4,544,989 | 10/1985 | Nakabu et al. ............ 361/401 |
| 4,630,096 | 12/1986 | Drye et al. ............ 361/401 |
| 4,640,010 | 2/1987 | Brown ............ 361/401 |
| 4,700,276 | 10/1987 | Freyman et al. ............ 361/414 |
| 4,700,473 | 10/1987 | Freyman et al. ............ 361/414 |
| 4,729,061 | 3/1988 | Brown ............ 361/401 |
| 4,744,008 | 5/1988 | Black et al. ............ 361/401 |
| 4,827,377 | 5/1989 | Butt ............ 361/401 |
| 4,880,684 | 11/1989 | Boss et al. ............ 428/209 |
| 4,882,657 | 11/1989 | Braun ............ 361/412 |
| 4,931,853 | 6/1990 | Ohunchi et al. ............ 357/68 |
| 4,999,740 | 3/1991 | Ilandi et al. ............ 361/401 |
| 5,032,896 | 7/1991 | Little et al. ............ 357/75 |
| 5,046,242 | 9/1991 | Kuzma ............ 29/878 |
| 5,048,179 | 9/1991 | Shindo et al. ............ 357/74 |
| 5,049,980 | 9/1991 | Saito et al. ............ 357/75 |
| 5,081,563 | 1/1992 | Feng et al. ............ 361/414 |

FOREIGN PATENT DOCUMENTS

| | | | |
|---|---|---|---|
| 0002173 | 1/1977 | Japan ............ | 357/80 |
| 52-49783 | 4/1977 | Japan ............ | 357/71 |
| 2810054 | 9/1978 | Japan ............ | 357/80 |
| 0046762 | 2/1988 | Japan ............ | 357/75 |
| 1-19089 | 5/1989 | Japan ............ | 439/67 |
| 2153144 | 8/1985 | United Kingdom ............ | 357/75 |

OTHER PUBLICATIONS

IBM Technical Disclosure Bulletin "High Density & Speed Performance Chip Joining Procedure and Package" vol. 15, No. 4, Sep. 1972.

Primary Examiner—Lincoln Donovan
Assistant Examiner—D. Sparks
Attorney, Agent, or Firm—Marvin Snyder

[57] ABSTRACT

An improved high density interconnect structure may include electronic components mounted on both sides of its substrate or a substrate which is only as thick as the semiconductor chips which reduces the overall structure thickness to the thickness of the semiconductor chips plus the combined thickness of the high density interconnect structure's dielectric and conductive layers. In the two-sided structures, feedthroughs, which are preferably hermetic, provide connections between opposite sides of the substrate. Substrates of either of these types may be stacked to form a three-dimensional structure. Means for connecting between adjacent substrates are preferably incorporated within the boundaries of the stack rather than on the outside surface thereof.

13 Claims, 9 Drawing Sheets

COMPACT HIGH DENSITY INTERCONNECT STRUCTURE

RELATED APPLICATIONS

This application is related to patent application Ser. No. 250,010, filed Sep. 27, 1988, entitled, "High Density Interconnect With High Volumetric Efficiency", by C. W. Eichelberger et al., patent application Ser. No. 454,546, filed Dec. 21, 1989, entitled, "Hermetic High Density Interconnected Electronic System" by W. P. Kornrumpf et al. and patent application Ser. No. 07/504,769, filed Apr. 5, 1990, entitled, "A Flexible High Density Interconnect Structure and Flexibly Interconnected System", by C. W. Eichelberger et al., each of which is incorporated herein by reference in its entirety.

BACKGROUND OF THE INVENTION

1. Field of the Invention

The present invention relates to the field of high density interconnection of electronic chips to form electronic systems, and more particularly, to techniques for increasing the density of such systems.

2. Background Information

A high density interconnect (HDI) structure or system which has been developed by General Electric Company offers many advantages in the compact assembly of electronic systems. For example, an electronic system such as a micro computer which incorporates 30–50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E. I. du Pont de Nemours Company, which is $\approx 0.0005$–$0.003$ inch ($\approx 12.5$–$75$ microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the Patents and applications which are listed hereinafter.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

This high density interconnect structure, methods of fabricating it and tools for fabricating it are disclosed in U.S. Pat. No. 4,783,695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnect Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230.654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638 filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 361,623 filed Jun. 5, 1989, entitled, "Adaptive Lithography Accommodation of Tolerances and Chip Positioning in High Density Interconnect Structures", by T. R. Haller; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546 filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.; application Ser. No. 07/504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al.; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

Related application Ser. No. 250,010, entitled "High Density Interconnect With High Volumetric Efficiency" discloses a number of techniques for stacking a plurality of these high density interconnect structures together to form a more complex system. In one embodiment, wrap-around contacts are provided along each of the edges of the substrates prior to beginning of fabrication of the system. The chips are then disposed on the substrate and the high density interconnect structure for that substrate fabricated, including appropriate connections to the wrap-around edge contacts on the substrate. A plurality of substrates of this type of the same size are then stacked and secured as a stack. A high density interconnect structure is then formed on one or more sides of this stack to interconnect the various substrates in an appropriate manner. Where connections are required along all four sides of a rectangular stack, four separate high density interconnect structures must be formed, one on each side surface of that stack. While effective, this is an undesirably complex process and has the further disadvantage that the individual substrates of the stack are thermally insulated from any exterior heat sink by the high density interconnect structures formed on the side surfaces of the stack. In an alternative embodiment disclosed in that application, a sequence of progressively smaller substrates are fabricated in accordance with the high density interconnect process and provided with contact pads on the upper surfaces of their high density interconnect structure. These substrates are then stacked and bonded together to form a pyramid. Wire bonds are employed to connect between contact pads on different ones of these substrates. While effective this technique has the disadvantage that the progressively smaller substrates limit the top substrates in the stack to supporting substantially fewer chips than the lower substrates in the stack. Another disadvantage of this structure is the presence of the wire bonds which are a less reliable form of interconnection than the high density interconnect structure itself, and thus, can be the reliability-limiting feature of such a three-dimensional structure. This application also discloses a high density interconnect structure which has no substrate and thus, can be flexible. Related application Ser. No. 07/504,769, entitled "A Flexible High Density Interconnect Structure and Flexibly Interconnected System" discloses a variety of flexible high density interconnect structures.

Related application Ser. No. 454,546 entitled "Hermetic High Density Interconnected Electronic System" discloses the inclusion of hermetic feedthroughs in the substrate of a high density interconnect structure in order that a hermetically sealed structure may be provided.

There is a continuing need for increased density, increased processing flexibility and increased structural variety in high density interconnect structures to meet various system requirements and needs.

OBJECTS OF THE INVENTION

Accordingly, a primary object of the present invention is to provide a high density interconnect structure having electronic components mounted on both sides of its substrate.

Another object of the present invention is to provide direct interconnection between circuits on opposite sides of a high density interconnect structure substrate.

Another object of the present invention is to provide a higher density three-dimensional high density interconnect structure.

Another object of the present invention is to provide a three-dimensional stack of high density interconnected structures which may be free of wire bonds and externally applied high density interconnect structures.

Another object of the present invention is to minimize the thickness of the individual high density interconnect structures in a stacked high density interconnect structure.

Another object of the present invention is to provide a high density interconnect structure capable of including more silicon area on a single substrate than the area of one major surface of that substrate.

Another object of the present invention is to provide a system comprising a stack of high density interconnect structures which is hermetically sealed with the high density interconnect structures themselves forming part of the hermetic enclosure.

Another object of the present invention is to provide substrate-to-substrate interconnections at any desired location within the area of a stack of high density interconnect structure substrates.

Another object of the present invention is to reduce the number of process steps involved in the fabrication of a three dimensional high density interconnect structure.

SUMMARY OF THE INVENTION

The above and other objects which will become apparent from the specification as a whole, including the drawings, are accomplished in accordance with one embodiment of the present invention by providing feedthroughs in the high density interconnect structure's substrate, disposing chips on both sides of the substrate and interconnecting the chips on each side of the substrate with separate high density interconnect structures with the two high density interconnect structures being interconnected through the feedthroughs in the substrate or by wrap-around conductors.

High density interconnect structure substrates of this type, after testing, may be stacked to provide a 3-D structure by including means within the stack for connecting conductors at adjacent faces of different substrates. This means for connecting is preferably disposed inside the peripheral boundaries of both substrates. Alternatively, substrates having feedthroughs therein, but with high density interconnect structure on only one surface thereof, may be stacked in a similar manner.

In accordance with an alternative embodiment, a stack of this type may be rendered hermetic by employing a base substrate which is larger than the other substrates and providing it with a peripheral seal ring. After the structure has been stacked and tested, a hermetic cup or other appropriate remainder of a hermetic enclosure may be bonded to the seal ring to hermetically seal all of the electronic components of the stack in a single container (the base substrate in this structure having electronic components only on its inward surface). Alternatively, the base substrate may have electronic components on both surfaces along with seal rings on both surfaces and two separate hermetic cups may be used to seal two separate sub-stacks, one on each side of the base substrate.

Alternatively, a hermetic seal may be provided by including top and bottom substrates in the stack which have electronic components only on their side toward the stack and after testing of the stack, hermetically sealing the sidewalls of the stack by bonding metal plates or other appropriate structures to the exposed edges of the substrates at the sides of the stack.

In an alternative embodiment, the electronic chips are disposed in apertures in the substrate with their contact surfaces in substantially the plane of one major surface of the substrate and their back surfaces in substantially the plane of the other major surface of the substrate whereby each high density interconnect structure substrate exhibits a minimum thickness. These frame substrates preferably include feedthroughs and may be stacked to form a non-hermetic stack as has been described and/or used as interior substrates in a hermetic stack.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
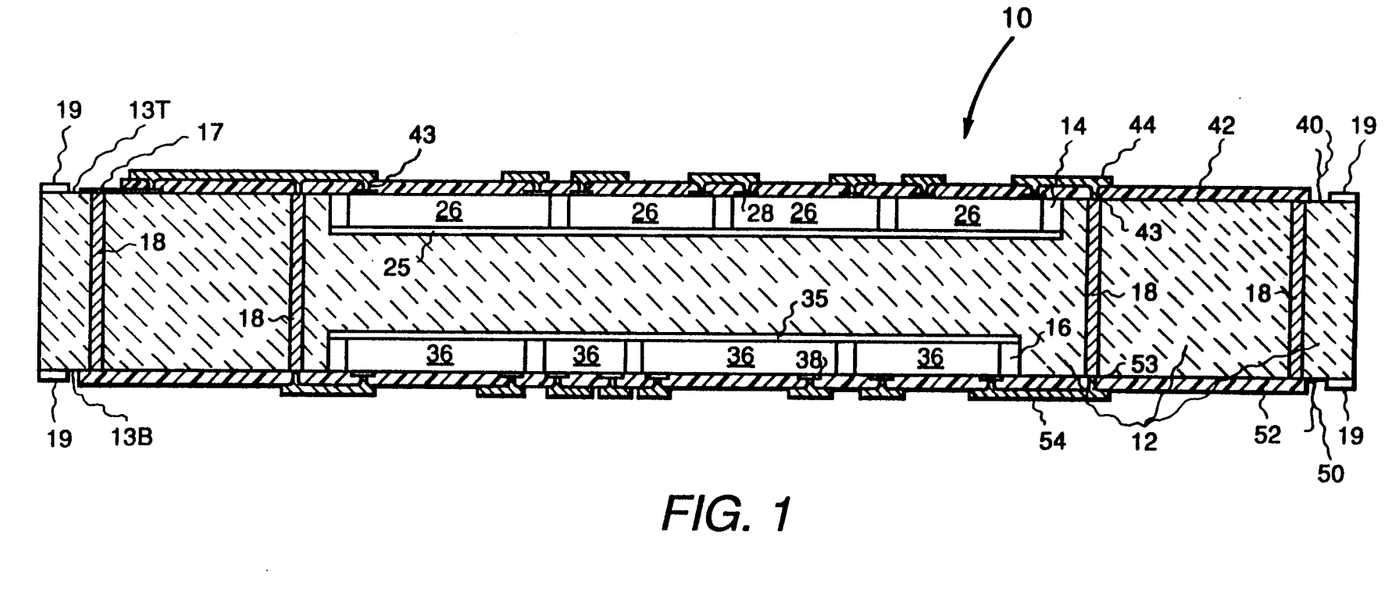
FIG. 1 is a cross-section view of a two-sided high density interconnect structure in accordance with the present invention.

In FIG. 1, a two-sided high density interconnect structure 10 in accordance with the present invention is illustrated in cross-section. The structure 10 comprises a substrate 12 having a top surface 13T and a bottom surface 13B. Substrate 12 is preferably alumina or another ceramic material. The top surface 13T of the substrate 12 has a cavity 14 therein in which a plurality of electronic chips 26 are disposed. Each of the chips 26 has contact pads 28 disposed on its upper or contact surface. Each of these chips is secured to the substrate by a thermoplastic polymer adhesive layer 25 which may preferably be ULTEM ® polyetherimide resin available from General Electric Company. A similar cavity 16 in the lower surface 13B of the substrate 12 has a plurality of chips 36 disposed therein. Each of these chips has contact pads 38. The chips 36 are bonded to the substrate 12 by a thin layer of thermoplastic adhesive 35. Extending vertically through the substrate 12 are a plurality of preferably hermetic feedthroughs 18 which enable connections to be formed between the front and back surfaces of the substrate 12. By a hermetic feedthrough, we mean a conductor which extends through the substrate and which is sealed to the substrate in a gas-tight manner which enables objects on one side of the substrate to be isolated from all contaminants on the other side of the substrate when another member which incloses those objects is sealed to the substrate in a hermetic manner. A high density interconnect structure 40 is disposed on the upper surface 13T of the substrate 12. The structure 40 comprises a polymer dielectric layer 42 bonded to the upper surface 13T of the substrate and the contact surfaces of the chips. A plurality of via holes 43 are disposed in the dielectric layer 42 in alignment with contact pads of the chips 26, the feedthrough conductors 18 and, if present, other conductors 17 disposed on the substrate. A pattern of conductors 44 is disposed on the upper surface of the dielectric layer 42 with individual conductors extending into selected via holes to provide electrical connection between that conductor and the contact pad 28, the feedthrough conductor 18 or a surface conductor 17, as may be desired.

A similar high density interconnect structure 50 is disposed on the lower surface 13B of the substrate 12 and includes a dielectric layer 52 bonded to the chips and the lower surface 13B of the substrate and having via holes 53 therein and a pattern of conductors 54 interconnecting selected ones of the contact pads and feedthroughs. At the periphery of the substrate 12, separate seal rings 19 are disposed on the upper and lower surfaces of the substrate 12. If desired, the seal ring material may also extend over the peripheral edge of the substrate to make the seal rings 19 continuous with each other.

Another features shown in FIG. 1 is a feedthrough conductor 18' disposed under and in electrical contact with the back surface of one of the chips 26. One of the conductors of the pattern of conductors 44 above the chip 26 is electrically connected to the feedthrough conductor 18' and thus to the back surface of the chip through one of the feedthrough conductors 18 and a conductor of the pattern of conductors 54.

Figure 2:
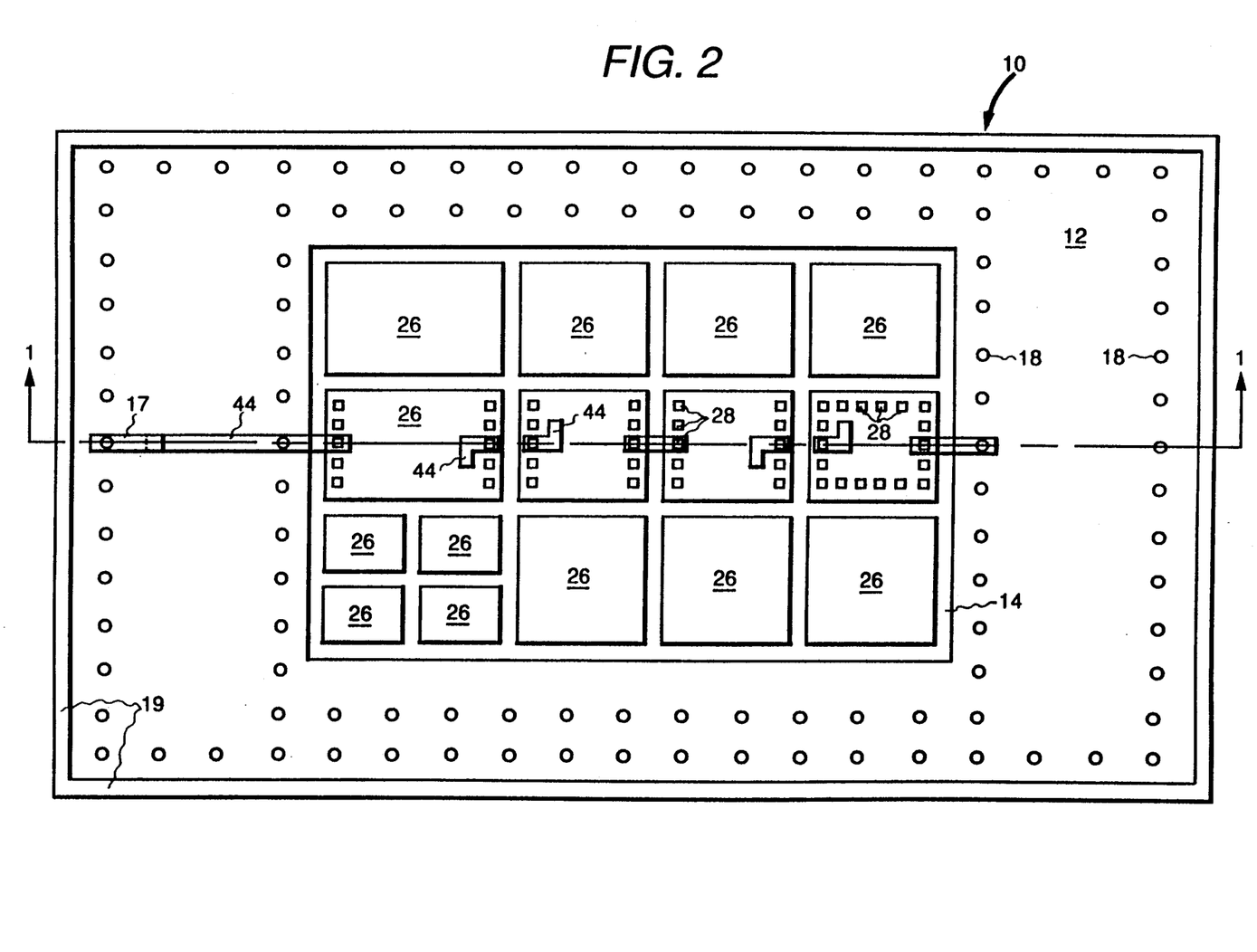
FIG. 2 is a plan view of the FIG. 1 structure.

The structure shown in FIG. 1 is shown in FIG. 2 in plan view with the line of the section of FIG. 1 indicated by the dashed line 1—1. It should be observed in the plan view of FIG. 2 that different sized chips may be incorporated in this structure as may be appropriate to the system being provided. Further, although the cavity 14 is shown as being rectangular in FIG. 2, it should be understood that it can take on whatever configuration is appropriate to the chips to be included in the system and their desired relative placement. Although a single cavity 14 is illustrated in FIG. 2, it should be recognized that a plurality of separate cavities may be used instead, with cavities varying from containing only a single chip to containing many chips.

The feedthrough conductors 18 may be formed in a ceramic substrate as part of the substrate fabrication process by forming holes in the green blank from which the substrate is formed and filling those holes with an appropriate conductive composition which will survive the firing temperature of the ceramic. However, such a procedure is not preferred. This is for several reasons. First, as is well known in the ceramics art, green ceramic slips are subject to significant shrinkage during firing with the result that the feedthroughs 18 would not be able to be positioned in specified exact locations. Second, conductive compositions which will survive firing of an alumina substrate are limited and normally have a higher resistivity than a number of metals which will not survive those firing temperatures. For this reason, it is preferred to fire the substrate blank prior to forming the holes for the feedthrough conductors 18. The holes for the feedthrough conductors 18 may then be accurately positioned through use of laser drilling or other high accuracy techniques for forming the holes in the substrate. Thereafter, the holes are preferably filled with a conductive metal composition which has a substantially higher conductivity than typical fired-in-place feedthroughs. MICRO-SUBSTRATES of 547-D Constitution Ave., Camarillo, Calif. 93010 offers the service of filling such holes in substrates. We have obtained substrates two inches square with two staggered rows of feedthrough holes along each side of the square approximately 100 mils from the edge of the square with the holes being 15 mils in diameter and positioned on 40 mil centers for a total of 348 feedthroughs. A majority of such substrates were hermetic as received. For those which were not hermetic as received, we found that electroplating additional metal on top of the feedthroughs rendered them hermetic. A typical thickness for this additional plating is 5 $\mu$m.

Naturally, where a hermetic structure is not required, a non-ceramic substrate may be employed, as may non-hermetic feedthroughs.

One of the differences between formed-in-place feedthroughs which have gone through firing and feedthroughs formed subsequently by filling holes in the already fired substrate are the different compositions of the feedthrough conductors and, in the latter case, the presence of an abrupt boundary between the feedthrough conductor material and the ceramic as compared to the fired-in-place situation wherein there is a diffuse boundary between the ceramic and the feedthrough conductor as a result of interdiffusion during the drying and firing processes for these fired-in-place conductors.

Figure 3:
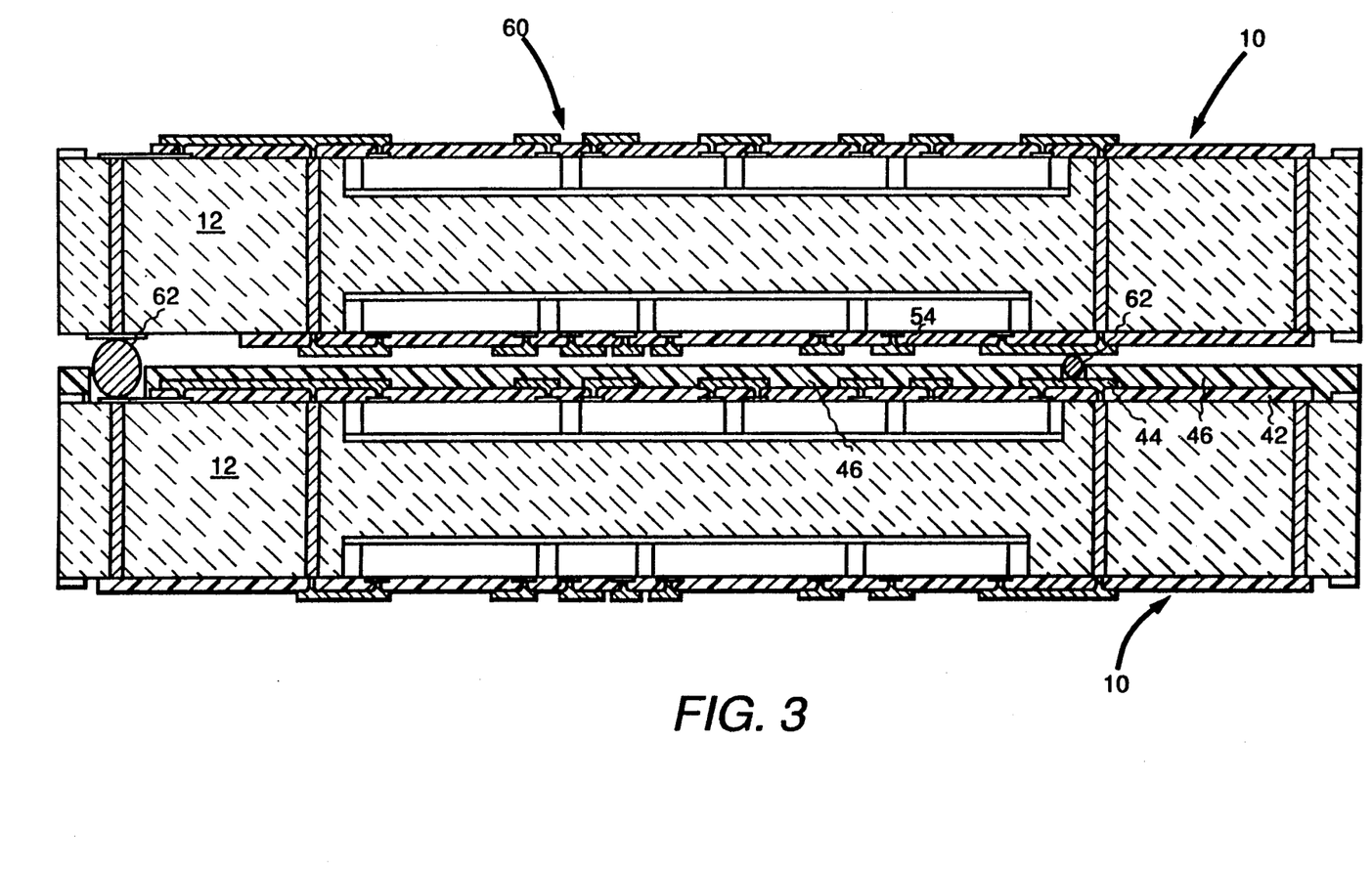
FIG. 3 is a cross-section view of a three-dimensional structure formed of a plurality of the FIG. 1 structures.

In FIG. 3, a stack 60 comprised of two segments 10 is illustrated in cross-section view. The two segments 10 have been stacked one on top of the other with conductive bumps 62 disposed therebetween to provide connection between selected conductors at the upper surface of the lower substrate 12 and other selected conductors at the lower surface of the upper substrate 12. The lower substrate 12 has an additional dielectric layer 46 included in its upper high density interconnect structure 40 in order to ensure insulation of its conductors 44 from any exposed conductors 54 on the lower surface of the upper substrate 12. If desired, a similar dielectric layer could be provided on the lower surface of the upper substrate to provide double assurance of the prevention of unintended connections.

The conductive bumps 62 may take a variety of forms. These may be solder bumps which are bonded to both substrates by raising the substrates to the reflow temperature of the solder employed. The dielectric layer 46 can serve as a stop for solder flow in those situations where the conductive bumps 62 comprise solder since the solder will not wet the dielectric layer and thus, because of the small size of the bumps 62 and the high surface tension of such small solder bumps when they are molten, no flow of the solder onto the upper surface of the dielectric layer 46 will occur under normal circumstances.

Alternatively, the conductive bumps 62 may be RTV, which is loaded with conductive material such as silver flakes. As a further alternative, they may be "fuzz buttons" available from Cinch Connector. As a still further alternative, they may be small diameter spheres of metal.

Where the conductive bumps 62 are fuzz balls, the fuzz balls may be thermocompression bonded to both substrates by scrubbing the substrates after placing them in position. Alternatively, the fuzz balls may be left unbonded and the structure may be held in intimate contact by the application of pressure to the stack to hold the individual substrates in intimate contact with the fuzz balls. Similar techniques may be employed with other conductive bump 62 compositions.

Figure 4:
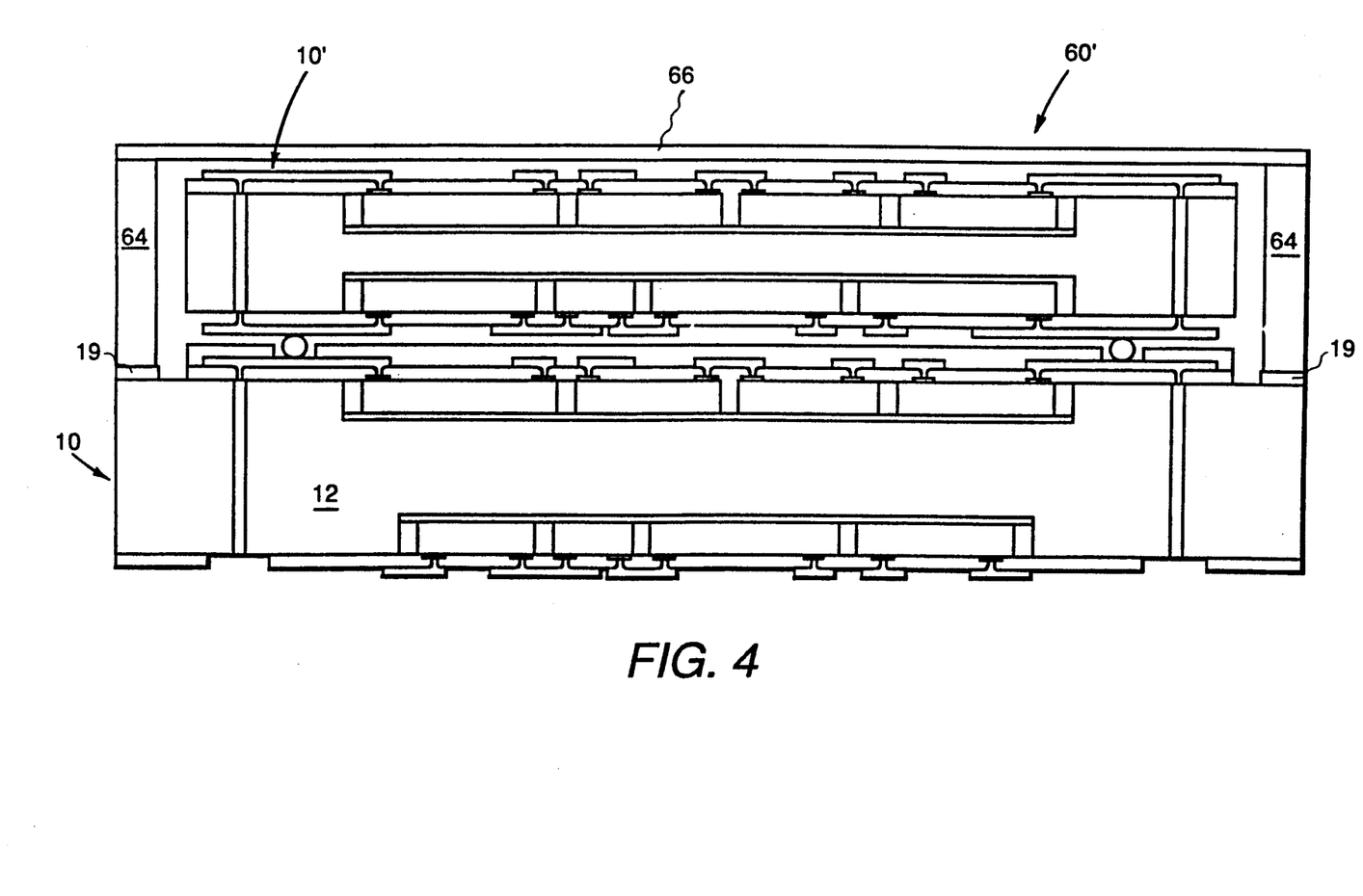
FIG. 4 illustrates a modified version of the FIG. 3 structure suitable for including one of the high density interconnect structures of the stack as a portion of a hermetic enclosure for the entire stack.

FIG. 4 is a cross-section illustration of an alternative configuration 60' for such a stack. In this stack, the upper segment 10' has a smaller cross-section than the lower segment 10. This leaves the seal ring 19 on the upper surface of the lower substrate 12 unobstructed. A sealing frame 64 has been disposed on this seal ring and bonded to it by an appropriate technique such as thermocompression bonding or solder flow. In the embodiment illustrated, a separate cap or cover 66 is sealed to the top of the frame 64 in order to hermetically enclose the upper segment 10' and the upper surface of the lower or base substrate 12.

Figure 5:
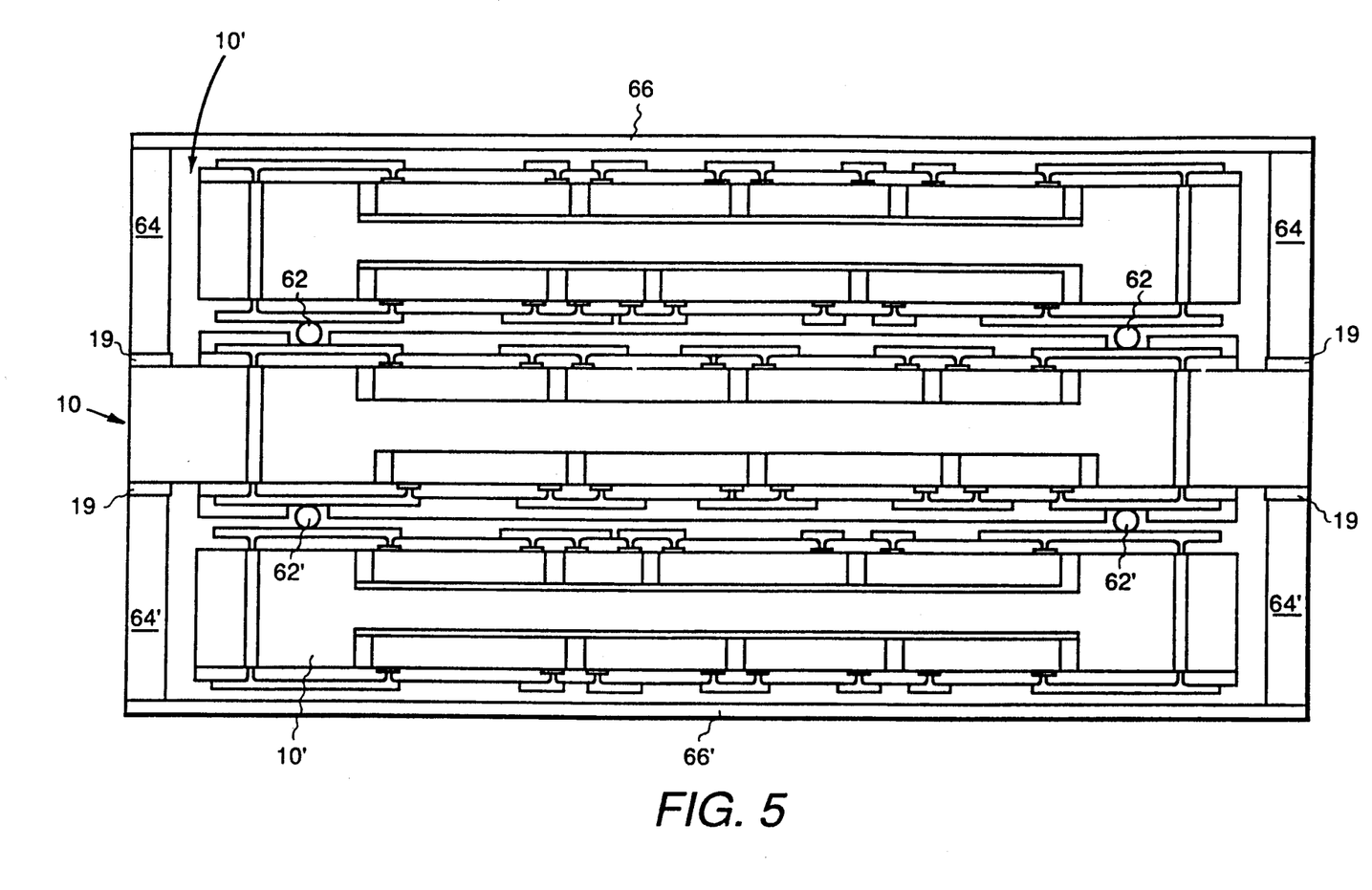
FIG. 5 is a cross-section illustration of an alternative configuration for the FIG. 4 structure in which the hermetic enclosure includes two separate sealed chambers.

If it is also desired to enclose the electronic components on the lower surface of the base segment's substrate 12 in a hermetic enclosure, that may be done using a similar frame 64' and cap 66' bonded to the lower seal ring 19 of the base segment's substrate 12 as shown in FIG. 5. If desired, more than one segment 10' may be enclosed within that lower hermetic chamber.

Figure 6:
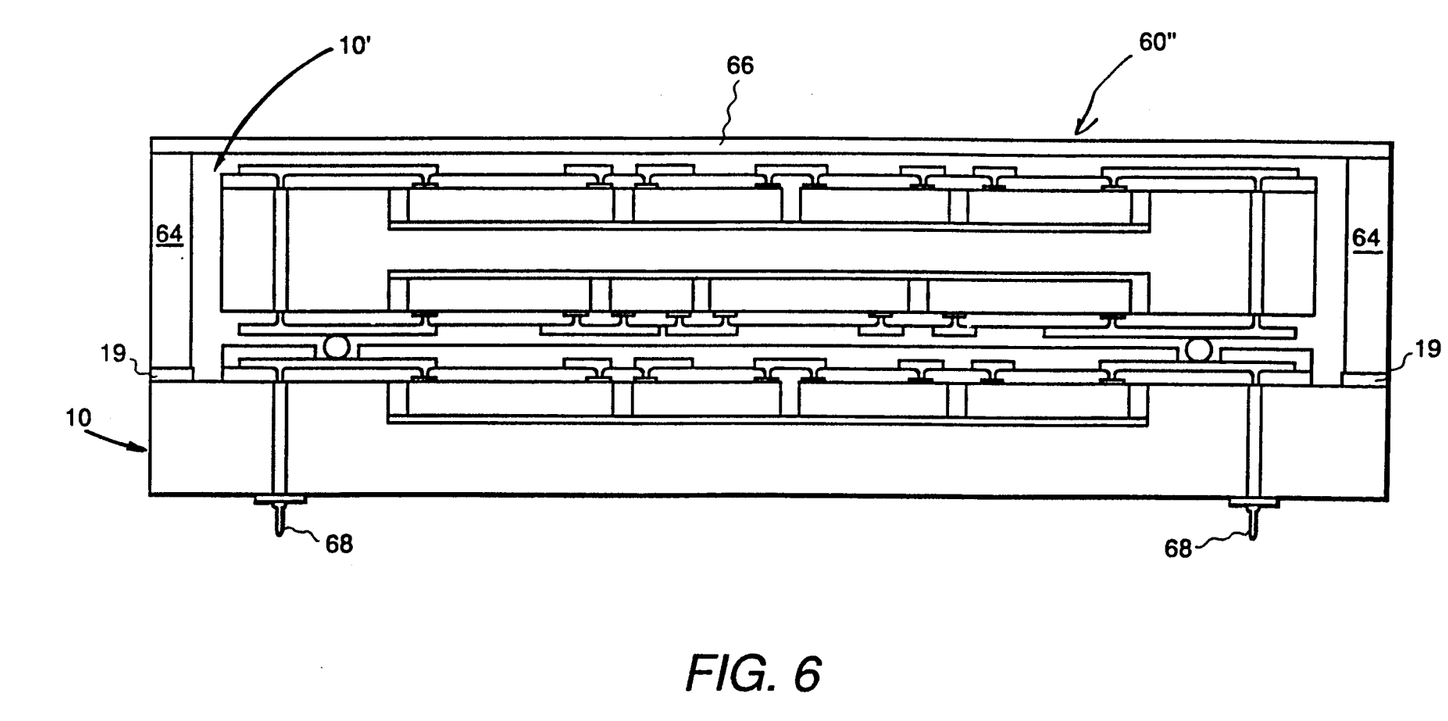
FIG. 6 is a cross-section illustration of a modified stack including external contact pins.

As another alternative, the base substrate may be a single sided substrate in which electronic components are not mounted on its lower surface. The feedthrough 18 may then be connected to external pins 68 for mounting the package 60'' into a circuit board or socket as shown in FIG. 6. This may be done either prior to or subsequent to high density interconnect structure fabrication. The pins 68 when installed prior to high density interconnect structure fabrication may be an integral portion of the metal which fills the holes in the substrate.

It should be understood that although a single substrate is shown in each of the hermetic chambers in FIGS. 4 and 5, any desired number of substrates may be stacked therein. Similarly, such a hermetic chamber may include two or more stacks of smaller substrates, if desired.

A further alternative configuration is to form a stack which is similar to that illustrated in FIG. 4 or 5, but in which the high density interconnect structures are single-sided rather than double-sided.

Figure 7:
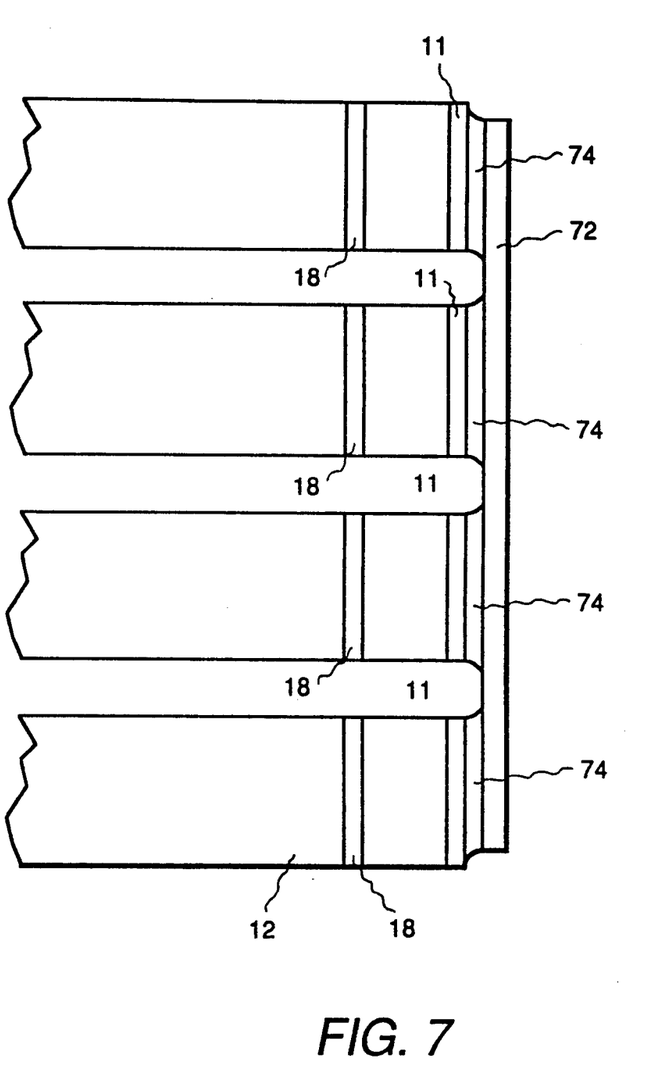
FIG. 7 is a cross-section view of a portion of an alternative configuration of a hermetic enclosure employing substrates of the stack as part of the enclosure.

FIG. 7 is a cross-section illustration of a portion of a stack in which all of the substrates have the same cross-sectional shape and a hermetic seal is provided by bonding a metal plate 72 to the side of the stack with solder 74 which bonds to an edge metallization 11 on the substrates. Other bonding techniques may also be used.

Figure 8:
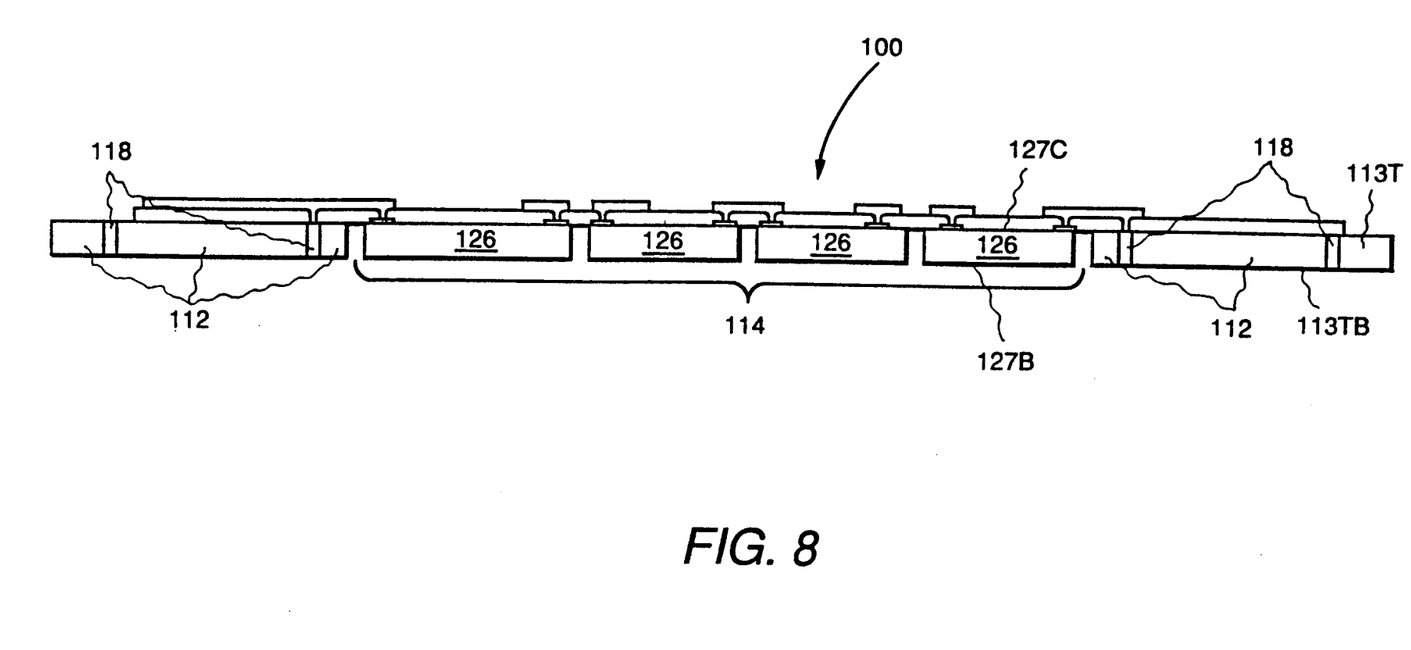
FIG. 8 a cross-section view of a high density interconnect structure in which electronic components are disposed in apertures in the substrate rather than in the cavity in the substrate.

A further alternative configuration 100 for a high density interconnect structure in accordance with the present invention is illustrated in cross-section in FIG. 8. The structure 100 is similar to the structure 10 with the exception that it is single-sided and the substrate 112 is only as thick as the chips 126 with the result that the chips 126 are disposed in an aperture 114 in the substrate 112, rather than in a cavity as in the FIG. 1 configuration. This structure appears in plan view as in FIG. 2 with the understanding that the opening 14 identified in FIG. 2 is an aperture in this configuration rather than a cavity. A plurality of separate apertures may be provided rather than one single large aperture as may be appropriate to the system to be packaged and other considerations. High density interconnect structures 100 may be stacked in the same manner as has been discussed for the structures 10 with the interconnection bumps directly contacting the lower ends of feedthroughs 118. Such stacking results in a minimum thickness three-dimensional stack since each of the structures 100 has a thickness equal to the thickness of the chips it interconnects plus the high density interconnect structure. Typically the chips are about 15 mils or 20 mils thick, whereas substrates are typically between 25 and 50 mils thick. A two-metallization-level high density interconnect structure typically is between 1.5 and 4 mils thick. This yields a total thickness of less than about 19 mils for 15 mil chips which is substantially less than the thickness of a high density interconnect structure employing a substrate which is 25 to 50 mils thick. The double-sided structure 10 of FIG. 1 improves on the density provided by a single-sided full substrate structure. The structure 100 using the frame substrate 112 provides the further benefit of eliminating the thickness of the portion of the substrate which is disposed between the cavities 14 and 16 in FIG. 1.

The high density interconnect structure 100 provides additional benefits for other applications. The substrate 100 provides rigidity for the overall structure. However, unlike systems in which the chips are disposed in a cavity in the substrate, the back surface of the chips is directly exposed which enables them to be cooled by a liquid or gaseous coolant by direct contact without intervening materials and boundaries. In this manner, this structure is similar to the substrate-less structures disclosed in related applications Ser. No. 250,010, "High Density Interconnect With High Volumetric Efficiency" and 07/504,769, "A Flexible High Density Interconnect Structure and Flexibly Interconnected System".

Inclusion of the connections between different segments of a multi-segment high density interconnect structure stack within the perimeter of the substrates provides a number of advantages. First, the position and alignment of the feedthrough conductors 18 can be accurately predetermined. Second, there is no need for wrap-around conductors on the substrate edges. Third, since more than one row of feedthroughs can be provided, a greater number of feedthroughs may be provided through a single substrate than can be provided by wrap-around conductors. Fourth, reduced tolerances on substrate dimensions may be employed since the edges of the substrates in the stack do not have to form as planar a surface as would be desirable where a high density interconnect structure is to be formed on that edge surface. Fifth, no high density interconnect structure needs to be formed on the exterior surface of the three-dimensional stack with the result that the individual substrates 12 may extend directly to the edge of the stack with the result that where the stack is expected to dissipate significant amount of power with a consequent need to extract heat, a heat sink may be directly attached to the edges of the substrates. For this purpose, it may be desirable to metallize the vertical edges of the substrates in order that they may be soldered to the heat sink itself or an intermediate metallic member.

While in FIG. 2 each of the feedthrough conductors 18 is illustrated as being the same size, it should be understood that some feedthrough conductors may be made larger, if that is considered desirable. Power and ground feedthrough conductors are particularly appropriate for such enlargement because of the relatively high currents they carry as compared to signal feedthrough conductors.

Figure 9:
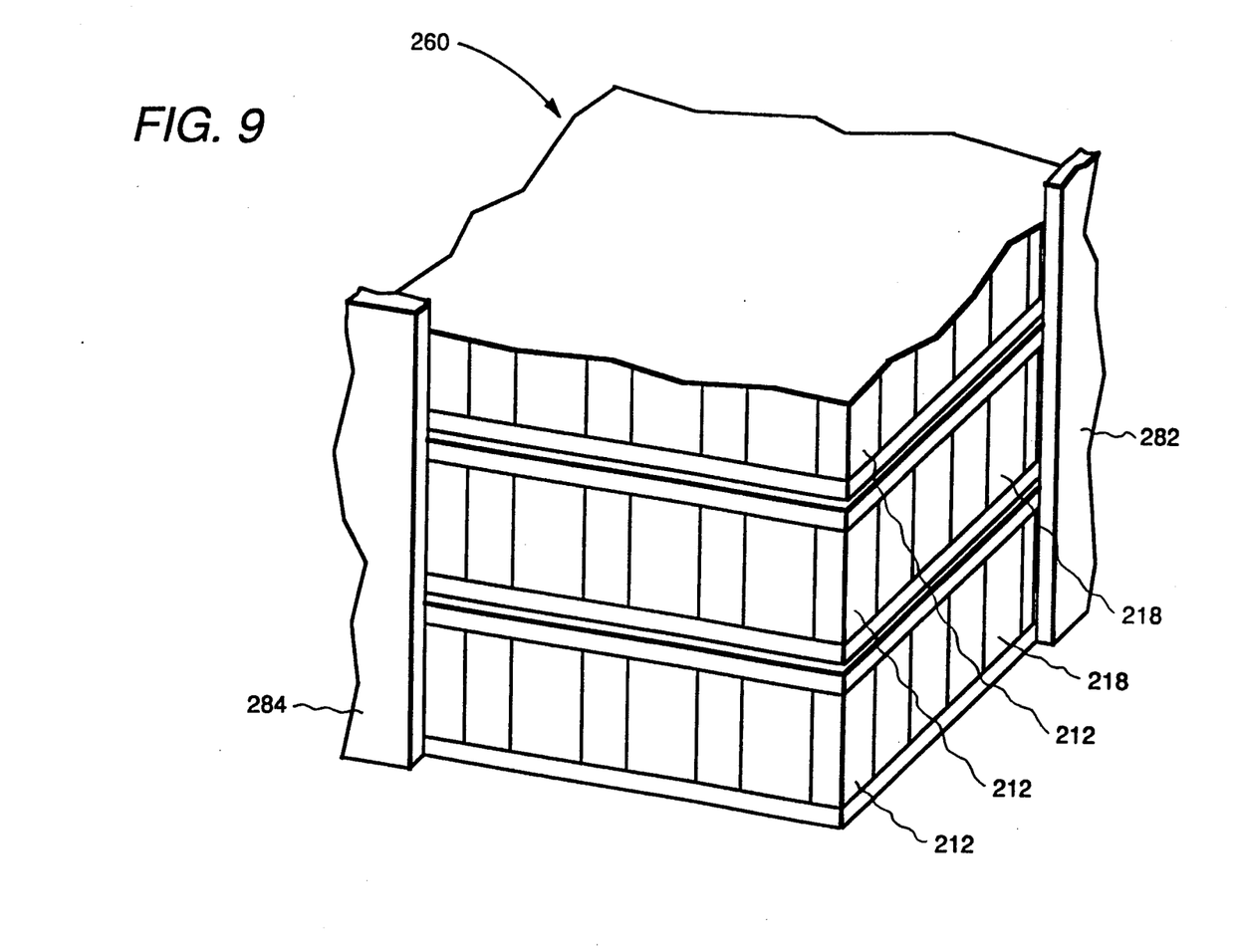
FIG. 9 is a perspective view of a portion of an alternative configuration of a three-dimensional high density interconnect structure stack in which power and ground buses are provided along the outside of the stack.

As an alternative to providing power and ground connections to the various substrates of the stack through the feedthrough conductors 18, in-laid edge conductors or wrap-around contacts 218 may be provided at the edges of substrates 212 as shown in stack 260 in FIG. 9. Some or all of the wrap-around conductors 218 may be connected within the segments as power and ground terminals. The power and ground wrap-around conductors are then directly connected to high capacity power buses 282 and ground buses 284 to ensure that all of the substrates operate at the same voltage. This may be done by placing both power and ground conductors on the same edge of a stack instead of on different edges of the stack as shown. If desired, some signal connections can be provided in this manner as well. In this configuration, the overall three-dimensional stack has its signal conductors provided in the manner taught in this application and its power and ground conductors provided in a manner similar to that taught in application Ser. No. 250,010.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic system comprising:
 a plurality of segments, each of said segments comprising:
  a substrate having a perimeter and first and second sides having first and second major surfaces, respectively, and a plurality of feedthrough conductors extending through said substrate, each of said feedthrough conductors having first and second ends associated respectively with said first and second sides of said substrate.
  an electronic component having contact pads on a contact surface thereof, said electronic component being disposed with its contact surface in substantially the plane of said first major substrate surface, and
  a high density interconnect structure bonded to said electronic component and said first major surface of said substrate, said high density interconnect structure including dielectric material and a pattern of conductors disposed on or in said dielectric material, said pattern of conductors including conductors electrically connected to said contact pads of said electronic component and conductors electrically connected to said feedthrough conductors;
 said segments being arranged in a stack, said stack comprising:
  means for electrically connecting conductors of different, adjacent ones of said segments to each other at adjacent surfaces of said adjacent segments, said means for electrically connecting being disposed within the perimeters of both of said adjacent substrates, and a base segment having a given substrate size and a stack segment having a smaller substrate, said base segment having a seal ring on said first major surface thereof; and a sidewall sealed to said seal ring for enclosing said stack substrate in an enclosure comprising said substrate of said base segment and said sidewall.

2. The system recited in claim 1 wherein:

said first ends of said feedthrough conductors are disposed substantially flush with said first major surface of said substrate and said pattern of conductors connects to said feedthrough conductors in substantially the same manner in which it connects to said contact pads.

3. The system recited in claim 1 wherein:

at adjacent surfaces of adjacent segments, the ends of said feedthrough conductors are disposed substantially flush with their associated major substrate surfaces.

4. The system recited in claim 1 wherein:

said base segment includes a second seal ring disposed on the second major surface of said base substrate;

a second sidewall sealed to said second seal ring for enclosing a second stack substrate in an enclosure comprised of said base substrate and said second sidewall.

5. The system recited in claim 1 wherein:

a first one of said substrates has a second electronic component disposed on its second major surface.

6. The system recited in claim 5 wherein:

said first substrate has a second high density interconnect structure bonded to said second major surface thereof and to said second electronic component.

7. The system recited in claim 1 wherein:

said means for electrically connecting comprises fuzz buttons.

8. The system recited in claim 1 wherein:

said means for electrically connecting comprises solder.

9. The system recited in claim 1 wherein:

said means for electrically connecting comprises a polymer loaded with conductive material.

10. The system recited in claim 1 wherein:

a portion of said system is enclosed in a hermetic enclosure; and said substrate of a first one of said segments comprises a portion of said hermetic enclosure.

11. The system recited in claim 10 wherein:

the substrate of said first segment is larger than some others of said substrates;

said substrate of said first segment is sealed to the remainder of an enclosure in which those other substrates are disposed to complete said hermetic enclosure.

12. The system recited in claim 10 wherein:

said enclosure comprises bottom, top and side walls; and said bottom comprises a substrate of said stack.

13. The system recited in claim 12 wherein:

said side wall comprises a member bonded to the edges of said substrates in said stack.

* * * * *